(12) United States Patent
Shirasuna et al.

(10) Patent No.: US 7,550,180 B2
(45) Date of Patent: Jun. 23, 2009

(54) PLASMA TREATMENT METHOD

(75) Inventors: Toshiyasu Shirasuna, Shizuoka (JP);
Tatsuyuki Aoike, Shizuoka (JP);
Kazuyoshi Akiyama, Shizuoka (JP);
Hitoshi Murayama, Shizuoka (JP);
Takashi Otsuka, Shizuoka (JP);
Daisuke Tazawa, Shizuoka (JP); Kazuto Hosoi, Shizuoka (JP); Yukihiro Abe, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/055,431

(22) Filed: Mar. 26, 2008

(65) Prior Publication Data

US 2008/0271676 A1    Nov. 6, 2008

Related U.S. Application Data

(62) Division of application No. 10/729,005, filed on Dec. 8, 2003, now abandoned, which is a division of application No. 09/899,188, filed on Jul. 6, 2001, now Pat. No. 6,761,128.

(30) Foreign Application Priority Data

Jul. 11, 2000    (JP)    .............................. 2000/209817

(51) Int. Cl.
*H01L 21/00*    (2006.01)
*C23C 16/00*    (2006.01)

(52) U.S. Cl. .................................... 427/569; 118/723 E

(58) Field of Classification Search ................. 427/569;
118/723 R, 723 E; 156/345.31, 345.32, 345.43,
156/345.44, 345.45, 345.46, 345.47; 315/111.21
See application file for complete search history.

(56) References Cited

U.S. PATENT DOCUMENTS

| | | | |
|---|---|---|---|
| 3,968,018 A | 7/1976 | Lane et al. | 204/192.3 |
| 4,615,298 A | 10/1986 | Yamazaki | 118/723 R |
| 4,972,799 A * | 11/1990 | Misumi et al. | 118/723 MW |
| 4,981,566 A | 1/1991 | Wurczinger | 204/192.13 |
| 5,076,205 A | 12/1991 | Vowles et al. | 118/719 |
| 5,084,125 A | 1/1992 | Aoi | 156/345.31 |
| 5,116,640 A | 5/1992 | Mikami et al. | 427/569 |
| 5,288,329 A | 2/1994 | Nakamura et al. | 118/729 |
| 5,324,360 A * | 6/1994 | Kozuka | 118/719 |
| 5,515,986 A | 5/1996 | Turlot et al. | 216/71 |

(Continued)

FOREIGN PATENT DOCUMENTS

JP    8-253862    10/1996

(Continued)

*Primary Examiner*—Parviz Hassanzadeh
*Assistant Examiner*—Michelle Crowell
(74) *Attorney, Agent, or Firm*—Fitzpatrick, Cella, Harper & Scinto

(57) ABSTRACT

In a plasma treatment method of and apparatus for treating the surface of a treatment target substrate by utilizing glow discharge produced by supplying high-frequency power into an inside-evacuated reactor through a high-frequency power supply means, a plurality of impedance regulation means for regulating impedances on the side of the reactor and on the side of the high-frequency power supply means are provided correspondingly to the impedances of a plurality of reactors, and the high-frequency power is supplied into the reactors via the impedance regulation means corresponding to the reactors. Plasma treatment can be made in a good efficiency and a low cost on a plurality of reactors having different impedances.

6 Claims, 12 Drawing Sheets

U.S. PATENT DOCUMENTS

| | | | |
|---|---|---|---|
| 5,922,134 A | 7/1999 | Ohbuchi | 118/723 ER |
| 5,948,166 A | 9/1999 | David et al. | 118/718 |
| 5,968,328 A | 10/1999 | Teschner et al. | 204/298.25 |
| 6,017,396 A * | 1/2000 | Okamoto | 118/719 |
| 6,145,469 A | 11/2000 | Teranishi et al. | 118/723 E |
| 6,273,955 B1 | 8/2001 | Yoshino et al. | 118/718 |
| 6,300,225 B1 * | 10/2001 | Okamura et al. | 438/478 |

FOREIGN PATENT DOCUMENTS

| | | |
|---|---|---|
| JP | 9-310181 | 12/1997 |
| JP | 11-319546 A | 11/1999 |

* cited by examiner

MATERIAL GAS

PLASMA TREATMENT METHOD

CROSS REFERENCE TO RELATED APPLICATIONS

This application is a division of U.S. application Ser. No. 10/729,005, filed on Dec. 8, 2003, which is a division of U.S. application Ser. No. 09/899,188, filed on Jul. 6, 2001, now U.S. Pat. No. 6,761,128. The disclosures of these prior applications are incorporated by reference herein in their entirety.

BACKGROUND OF THE INVENTION

1. Field of the Invention

This invention relates to a plasma treatment method and a plasma treatment apparatus which are used when material gases are decomposed by utilizing the phenomenon of discharge, to form deposited films on substrates or to etch or surface-modify the deposited films formed on substrates. More particularly, this invention relates to a plasma treatment method and a plasma treatment apparatus which are to form on substrates deposited films, in particular, functional deposited films, especially amorphous semiconductors used in semiconductor devices, electrophotographic light-receiving members, image input line sensors, imaging devices, photovoltaic devices and so forth.

2. Related Background Art

As device members used in semiconductor devices, electrophotographic light-receiving members, image input line sensors, imaging devices, photovoltaic devices and other various electronic devices and optical devices, non-single-crystal deposited films such as amorphous silicon as exemplified by amorphous silicon compensated with hydrogen and/or halogen (e.g., fluorine or chlorine) or crystalline deposited films such as diamond thin films have been proposed, some of which have been put into practical use. Such deposited films are formed by plasma CVD (chemical vapor deposition), i.e., a process in which material gases are decomposed by glow discharge produced by high-frequency or microwave power, to form deposited films on substrates made of stainless steel, aluminum or the like. Treatment methods and treatment apparatus therefor are also proposed in variety.

As an example of such apparatus, FIGS. 12A and 12B diagrammatically illustrates an example of the construction of a conventional apparatus for producing electrophotographic light-receiving members by high-frequency plasma CVD. FIG. 12A is its vertical cross-sectional view, and FIG. 12B, a transverse cross-sectional view along the line 12B-12B in FIG. 12A.

This apparatus is constituted basically of a deposition system 1001 having a reactor 1004 formed of a cylindrical dielectric member, a feed system 1002 for feeding material gases into the reactor 1004, and an evacuation system 1030 for evacuating the inside of the reactor 1004.

The deposition system 1001 has a first space 1005 formed inside the reactor 1004 and a second space 1006 formed between the reactor 1004 and a shield wall 1017. Cylindrical substrates 1010, members on which deposited films are formed, are each set to a substrate holder 1012 and is placed in the first space 1005. Also, in the first space 1005, a heater 1016 for heating each substrate from its interior and a material gas feed pipe 1015 are provided. Meanwhile, in the second space 1006, cathode rodlike electrodes 1011 are provided in substantially parallel to the sidewall of the reactor 1004, and a high-frequency power source 1040 is connected thereto via a high-frequency matching device 1041. The material gas feed system 1002 has cylinders (not shown) individually holding therein material gases such as $SiH_4$, $GeH_4$, $H_2$, $CH_4$, $B_2H_6$ and $PH_3$, valves (not shown) and mass flow controllers (not shown). The individual material gas cylinders are connected to the material gas feed pipe 1015 leading to the inside of the reactor 1004 via a valve 1026.

Using such a deposited film formation apparatus, deposited films are formed on the cylindrical substrates 1010 in the following way, for example.

First, the cylindrical substrates 1010, having been precisely cleaned in a dust-controlled environment such as a clean room, are each set to the substrate holder 1012 and disposed in the reactor 1004. Then, the inside of the reactor 1004 is evacuated by means of the evacuation system 1030.

Subsequently, a substrate-heating gas for heating the cylindrical substrates 1010 is fed into the reactor 1004 via the material gas feed pipe 1015. Next, by means of a mass flow controller (not shown), the substrate-heating gas is regulated so as to flow at a prescribed flow rate. To do so, the extent of opening of an evacuation valve 1031 is so regulated, watching a vacuum gauge (not shown), that the internal pressure of the reactor 1004 may come to be a prescribed pressure of, e.g., 133 Pa or below. At the time the internal pressure of the reactor 1004 has become stable, the temperature of each cylindrical substrate 1010 is controlled by the substrate heater 1016 to a prescribed temperature of from 50° C. to 450° C.

At the time the cylindrical substrates 1010 have come to have a prescribed temperature, material gases are fed into the reactor 1004 regulating each material gases so as to flow at a prescribed flow rate by means of mass flow controllers (not shown). To do so, the extent of opening of the evacuation valve 1031 is so regulated, watching a vacuum gauge (not shown), that the internal pressure of the reactor 1004 may come to be a prescribed pressure of, e.g., 133 Pa or below.

At the time the internal pressure of the reactor 1004 has become stable, the high-frequency power source 1040 having a frequency of, e.g., 105 MHz is set at a prescribed power and the high-frequency power is supplied into the reactor 1004 through the high-frequency matching device 1041 to cause glow discharge to take place. By the energy of this discharge, the material gases fed into the reactor 1004 are decomposed, so that the desired deposited films composed chiefly of silicon are formed on the cylindrical substrates 1010.

After the deposited films have come to have the desired layer thickness, the supply of high-frequency power and flowing of material gases into the reactor 1004 are stopped to finish the formation of deposited films.

Then, the like procedure may be repeated a plurality of times to form light-receiving layers having the desired multilayer structure.

Here, needless to say, valves other than those for necessary gases are closed when respective layers are formed. Also, the operation to full open the evacuation valve 1031 to once evacuate the inside of the system to a high vacuum is optionally made in order to avoid the respective gases from remaining in the reactor 1004 and in the piping which leads to the reactor 1004. Also, during the formation of deposited films, the cylindrical substrates 1010 are rotated by driving a motor 1020.

In the case where plasma treatment is made in this way, the impedance on the load side and the impedance on the high-frequency power source side are matched by means of the high-frequency matching device 1041. The impedance on the load side involves a stray capacitance component, an inductance component and a resistance component, and hence may greatly change depending on the conditions for plasma treatment and the shape of the apparatus for making the plasma treatment. Hence, the regulation of impedance requires specific values for each apparatus or for each plasma treatment condition.

As a method for matching impedances, it is common to match impedances by changing the capacitance of variable capacitors in a π-type or T-type circuit provided in the matching device. Also, when it is insufficient to regulate the impedance only in the matching device, as disclosed in, e.g., Japanese Patent Application Laid-Open No. 9-310181, capacitors are attached individually to a plurality of cathode electrodes so that the distance between the matching device and the cathode electrodes can be made larger whereby any changes in the induction component can be cancelled to match impedances. As also disclosed in Japanese Patent Application Laid-Open No. 8-253862, the length of an electrode lead-in shaft connected to a plasma-generating electrode and that of a coaxial cylindrical earth shield are set variable so as to enable adaptation to a variety of power source frequencies.

Such conventional methods and apparatus have attained a good state of matching. However, there is further room for improvement when it is intended to form deposited films in a good efficiency in actual production.

The above method for matching can certainly attain a good matching in respect of certain plasma treatment. When, however, the electrophotographic light-receiving members described above are produced, electrophotographic light-receiving members different in shape and film composition must be produced in conformity with electrophotographic apparatus greatly rich in variety. Accordingly, the impedance of reactors for forming deposited films changes. Moreover, in the case of multi-layer construction like the electrophotographic light-receiving members, the type of treating gas, the internal pressure, the high-frequency power and so forth change for each layer, and hence the impedance ascribable to plasma may also greatly change.

As a result, in conventional plasma treatment systems, an attempt to well match impedances in accordance with various forms of products may make it necessary to provide matching devices specifically designed for respective conditions, resulting in a high cost for the whole apparatus and furthermore providing an obstacle to the cost reduction of articles to be produced. Also, the matching device must be replaced every time the conditions for plasma treatment have changed. This causes a lowering of operating efficiency. Also, when any treatment under the like conditions is continuously made in order to prevent the operating efficiency from lowering, the flexibility of production may be held back, making it difficult to smoothly execute the adjustment of production that may have to be made because of a variety of production requirements or any accidental troubles.

Accordingly, in plasma treatment systems making use of high-frequency power as stated above, it has been sought to simplify production systems against manufacture of many kinds of articles, and to construct a plasma treatment apparatus, or early materialize a plasma treatment method, which can achieve low cost.

SUMMARY OF THE INVENTION

An object of the present invention is to provide a plasma treatment method and a plasma treatment apparatus which can carry out plasma treatment in a good efficiency and at a low cost, can carry out plural kinds of plasma treatment without causing any lowering of production efficiency, and have a superior productivity.

To achieve the above object, the present invention provides a plasma treatment method of treating the surface of a treatment target substrate by utilizing glow discharge produced by supplying high-frequency power into an inside-evacuated reactor through a high-frequency power supply means, wherein;

a plurality of impedance regulation means for regulating impedances on the side of the reactor and on the side of the high-frequency power supply means are provided correspondingly to the impedances of a plurality of reactors, and the high-frequency power is supplied into the reactors via the impedance regulation means corresponding to the reactors.

The present invention also provides a plasma treatment apparatus comprising:

a plurality of reactors each having an evacuatable inside where at least one treatment target substrate is set in, and having impedances different from each other;

a high-frequency power supply means for supplying high-frequency power into each reactor having been inside-evacuated, to cause glow discharge to take place in the reactor; and a plurality of impedance regulation means provided correspondingly to the impedances of the reactors in order to regulate impedances on the side of each reactor and on the side of the high-frequency power supply means.

BRIEF DESCRIPTION OF THE DRAWINGS

FIG. 6A is its vertical cross-sectional view, and FIG. 6B, a transverse cross-sectional view along the line 6B-6B in FIG. 6A.

FIG. 7A is its vertical cross-sectional view, and FIG. 7B, a transverse cross-sectional view along the line 7B-7B in FIG. 7A.

FIG. 10A is its vertical cross-sectional view, and FIG. 10B, a transverse cross-sectional view along the line 10B-10B in FIG. 10A.

FIG. 11A is its vertical cross-sectional view, and FIG. 11B, a transverse cross-sectional view along the line 11B-11B in FIG. 11A.

FIG. 12A is its vertical cross-sectional view, and FIG. 12B, a transverse cross-sectional view along the line 12B-12B in FIG. 12A.

DESCRIPTION OF THE PREFERRED EMBODIMENTS

The present inventors made extensive studies in order to overcome the above problems in the conventional plasma treatment method and plasma treatment apparatus to achieve the object of the present invention. As a result, they have discovered that a plasma treatment made on demand using a plurality of impedance regulation means for regulating impedances on the side of the reactor and on the side of the high-frequency power supply means in respect of a plurality of reactors having impedances different from each other enables achievement of a simple and low-cost production system against manufacture of many kinds of articles, and enables simultaneous achievement of both high operating efficiency and high production flexibility. Thus, they have accomplished the present invention.

According to the present invention, various plasma treatment conditions or various shapes of reactors for plasma treatment can be met by the use of one high-frequency power supply means, and hence the cost for the whole apparatus can be kept low and the cost of articles to be produced can be reduced. Also, it is unnecessary to replace the matching device every time the conditions for plasma treatment have changed. Hence, a high operating efficiency can be achieved and also, keeping such a high operating efficiency, the adjustment of production that may have to be made because of a variety of production requirements or any accidental troubles can smoothly be made, bringing about an improvement in the production flexibility.

Embodiments of the present invention are described below with reference to the accompanying drawings.

Figure 1:
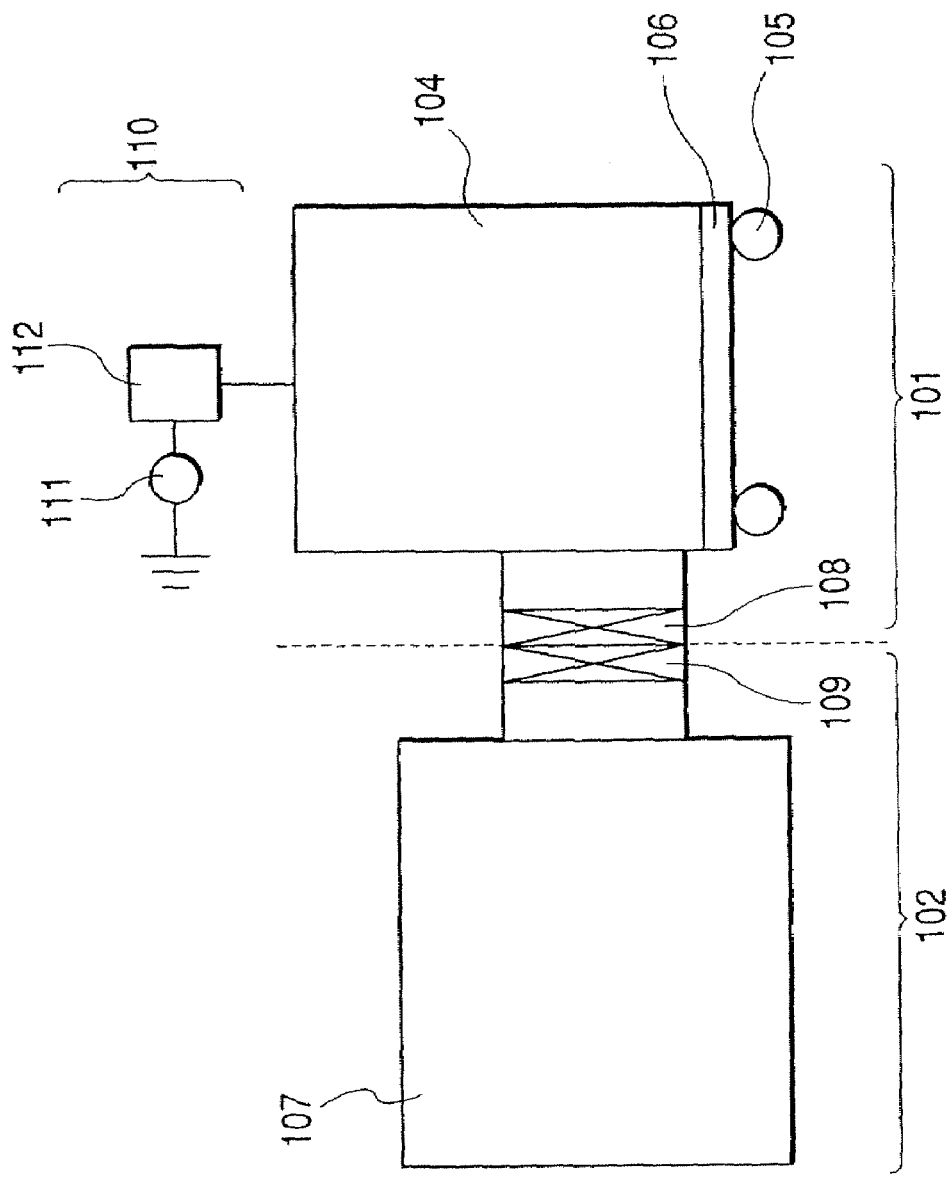
FIG. 1 is a side view diagrammatically showing an example of an apparatus for forming deposited films of electrophotographic light-receiving members by using the plasma treatment method of the present invention.

FIG. 1 is a side view diagrammatically showing an example of an apparatus for forming deposited films of electrophotographic light-receiving members by using the plasma treatment method of the present invention.

As shown in FIG. 1, the deposited-film formation apparatus of the present embodiment has a movable reactor section 101 having a movable reactor 104, an evacuation section 102 for evacuating the inside of the reactor 104, a high-frequency power supply means 110 for supplying high-frequency power into the reactor 104, and a material gas feed means (not shown) for feeding material gases into the reactor 104.

The movable reactor section 101 has the reactor 104, which is covered with a shield (not shown in FIG. 1) on its outer sidewalls, a support stand 106 to which casters 105 are set as a moving means, and a joining flange 108 for airtight-joining the reactor 104 to the evacuation section 102.

Inside the reactor 104, it has substrate holders for holding cylindrical substrates on which deposited films are to be formed, a material gas feed pipe, substrate heaters and so forth (all not shown).

There are no particular limitations on the moving means as long as it can move the reactor 104. Any means making use of casters, a belt or belts, magnetic floating, air floating or the like may be used. In view of readiness to handle and cost, a means making use of the casters 105 as in the present embodiment is preferred.

There are also no particular limitations on the shape of the reactor 104. In order to form deposited films more uniformly, it is preferable to fit its shape to the shape of the member on which the deposited films are to be formed. Where members on which deposited films are to be formed are substrates for electrophotographic light-receiving members as in the present embodiment, the substrates have a cylindrical shape and, from the viewpoint of productivity, the substrates are arranged in plurality on the same circumference. Accordingly, as the shape of the reactor 104, it is common to use those having a cylindrical shape like the substrates arranged in a circle. Also, the reactor 104 may preferably be made of a material such as aluminum, stainless steel or alumina ceramics in view of mechanical strength and vacuum-keeping ability.

The evacuation section 102 has a joining flange 109 joined with the joining flange 108 of the movable reactor section 101, and an evacuation means 107 such as a vacuum pump, joined to the movable reactor section 101 via the joining flange 109.

The high-frequency power supply means 110 is set separable from the movable reactor section 101, and has a high-frequency power source 111 for generating plasma in the reactor 104, and a high-frequency matching device 112 for supplying the high-frequency power to the reactor 104 side in a good efficiency and matching the impedance on the side of the reactor 104 and the impedance on the side of the high-frequency power source 111.

An outline of a procedure for the plasma treatment method making use of this plasma treatment apparatus is described below.

Figure 2:
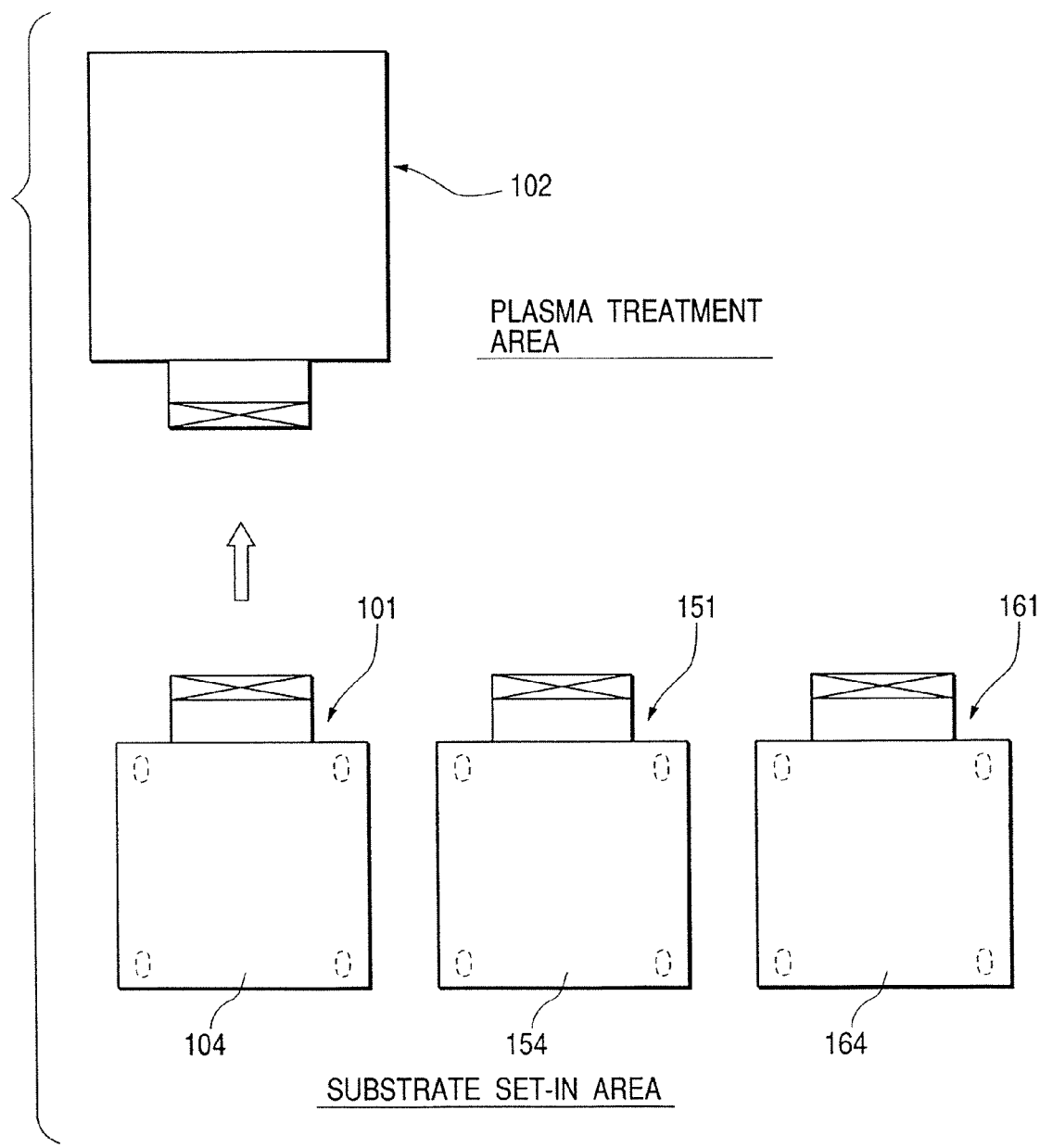
FIG. 2 a top plan view showing positional arrangement of movable reactor sections provided in the apparatus for deposited-film formation shown in FIG. 1.

First, in the state the movable reactor section 101 is kept separate from the evacuation section 102 and the high-frequency power supply means 110, the cylindrical substrates are set in the reactor 104. In the following description, an area in which the operation to set the cylindrical substrates in the reactor is made is called a substrate set-in area and an area in which the evacuation section and the high-frequency power supply means are provided and the plasma treatment is made with respect to the movable reactor section is called a plasma treatment area (see FIG. 2 given later).

Thereafter, the inside of the reactor 104 is evacuated until it comes to have a desire pressure. Here, if necessary, the cylindrical substrates may be heated with the substrate heaters or an inert gas feed system (not shown) may be connected to the reactor 104 to feed an inert gas such as $N_2$ gas, Ar gas or He gas into the reactor 104.

Next, the movable reactor section 101 is moved to the position at which the evacuation section 102 is set, and the joining flanges 108 and 109 of the both are brought into contact at their openings via a vacuum sealing material to join the movable reactor section 101 and the evacuation section 102 to each other.

After the movable reactor section 101 and the evacuation section 102 have been joined, their joint is optionally fastened by a fastening means such as screws or a clamp. Having made sure that the movable reactor section 101 has been joined to the evacuation section 102, the inside of the reactor 104 is evacuated by the evacuation means 107 of the evacuation section 102.

The order up to this stage, in which the substrates are set in the reactor 104, the evacuation section 102 is moved and the movable reactor section 101 is joined to the evacuation section 102, is by no means limited to the above order. For example, after the substrates have been set, the movable reactor section 101 may be moved and joined to the evacuation section 102 without evacuating the inside of the reactor 104, or the movable reactor section 101 may be moved after the desired gases have been fed into the reactor 104 at a prescribed pressure. Alternatively, the substrates may be set in the reactor 104 after the movable reactor section 101 has been joined to the evacuation section 102. Besides, the inside of the reactor 104 may be brought into a deposited-film formable state before the movable reactor section 101 is joined to the evacuation section 102 and the step of forming deposited films may be started. Specific orders of procedure may be determined taking account of operating efficiency, productivity and so forth in each production step.

After the movable reactor section 101 has been joined to the evacuation section 102, the high-frequency power supply means 110 present in the plasma treatment area is connected to the reactor 104.

Thus, after the substrates have been set in the reactor 104 and the inside of the reactor 104 has been evacuated by the evacuation means 106, the cylindrical substrates are optionally heated with the substrate heaters to a prescribed temperature and their temperature is controlled. At the time the cylindrical substrates have come to have the prescribed temperature, the material gases are fed into the reactor 104 from the material gas feed means via the material gas feed pipe. Having made sure that the flow rates of material gases have come to any preset flow rates and also the internal pressure of the reactor 104 has become stable, a prescribed high-frequency power is supplied to the cathode electrode from the high-frequency power source 111 via the high-frequency matching device 112. The high-frequency power thus supplied causes glow discharge to take place in the reactor 104, and the material gases are excited and dissociated, whereupon deposited films are formed on the cylindrical substrates.

After the deposited films have been formed in the desired thickness, the supply of high-frequency power is stopped and subsequently the feeding of material gases is stopped to finish the formation of deposited films. Where deposited films are formed in a multi-layer structure, the like procedure is repeated a plurality of times. In this case, to form the next layer, the discharge may once completely be stopped at the time the formation of one layer has been completed as described above, the setting of gas flow rates and pressure may be changed for that for the next layer, and thereafter the discharge may be caused to take place to form the next layer. Alternatively, in a prescribed time after the formation of one layer has been completed, the gas flow rates, pressure and high-frequency power may gradually be changed to any preset values for the next layer to form a plurality of layers continuously.

Here, the substrate holders set in the reactor 104 may be so provided as to be rotatable by means of a motor around the axes of the cylindrical substrates set to the substrate holders, and, during the formation of deposited films, the cylindrical substrates may optionally be rotated at a prescribed speed.

The foregoing is an outline of the procedure of forming the deposited films. In the present embodiment, as shown in FIG. 2, in addition to the movable reactor section 101 described above, a plurality of movable reactor sections 151 and 161 are kept ready for use whose reactors 154 and 164, respectively, have different impedances in accordance with, e.g., the shape of cylindrical substrates and the composition of deposited films to be formed. Then, among these, any prescribed movable reactor section 101, 151 or 161 is joined to the evacuation section 102 as occasion calls, where the plasma treatment described above is carried out. Here, the high-frequency power supply means 110 is used in common whatever prescribed movable reactor section 101, 151 or 161 is used to make plasma treatment.

As methods for making plasma treatment in this way using one high-frequency power supply means with respect to the movable reactors 104, 154 and 164, a method is available in which the variable capacitor in the high-frequency matching device 112 is set variable in a wide range to make it matchable to various impedances. However, setting it variable in a wide range makes its microadjustment difficult, or making its volume larger may cause a lowering of breakdown strength of the capacitor. Also, depending on the construction of the reactors, only setting the device variable in a wide range can not sufficiently deal with the matter in some cases.

Figure 3:
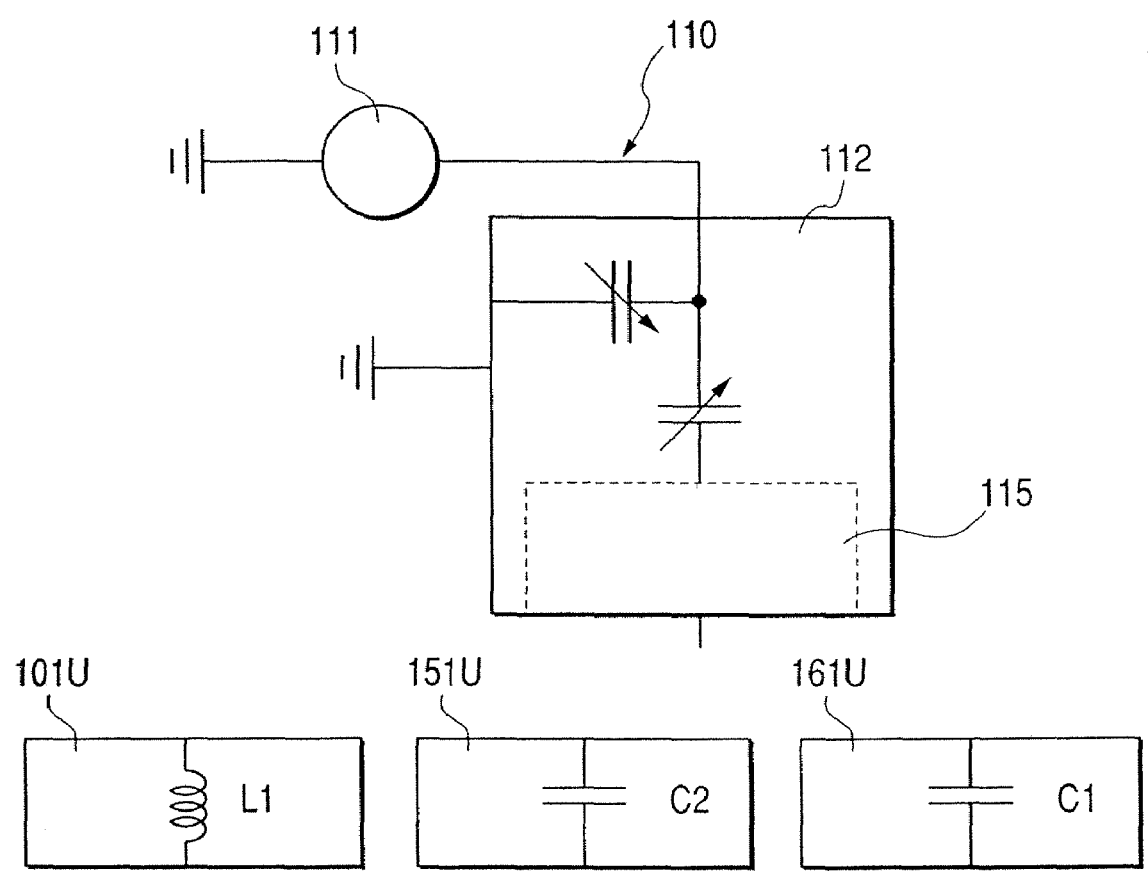
FIG. 3 is a diagrammatic illustration of an example of the impedance regulation means used in the deposited-film formation apparatus shown in FIG. 1.
Figure 4:
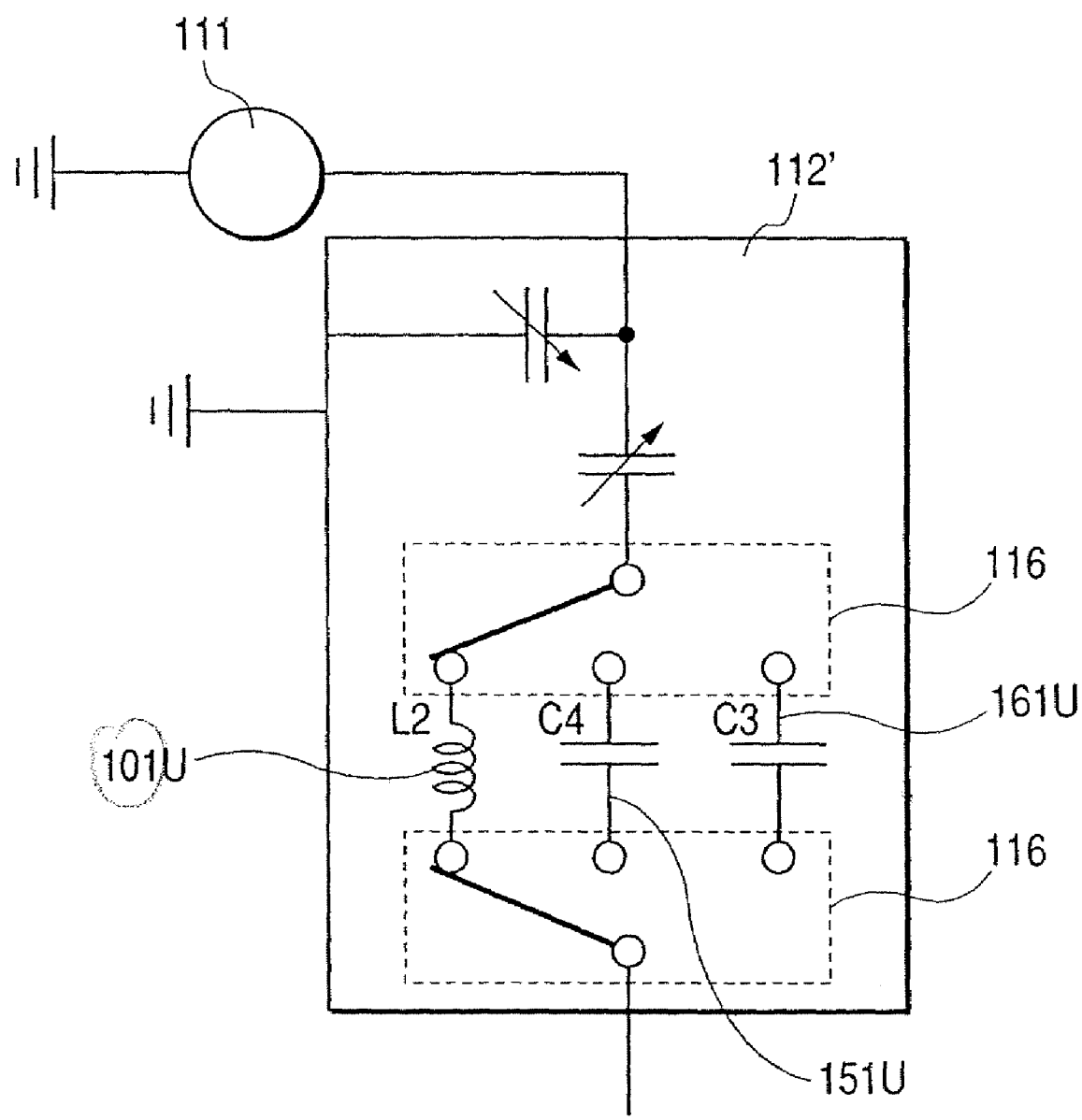
FIG. 4 is a diagrammatic illustration of another example of the impedance regulation means used in the deposited-film formation apparatus shown in FIG. 1.
Figure 5:
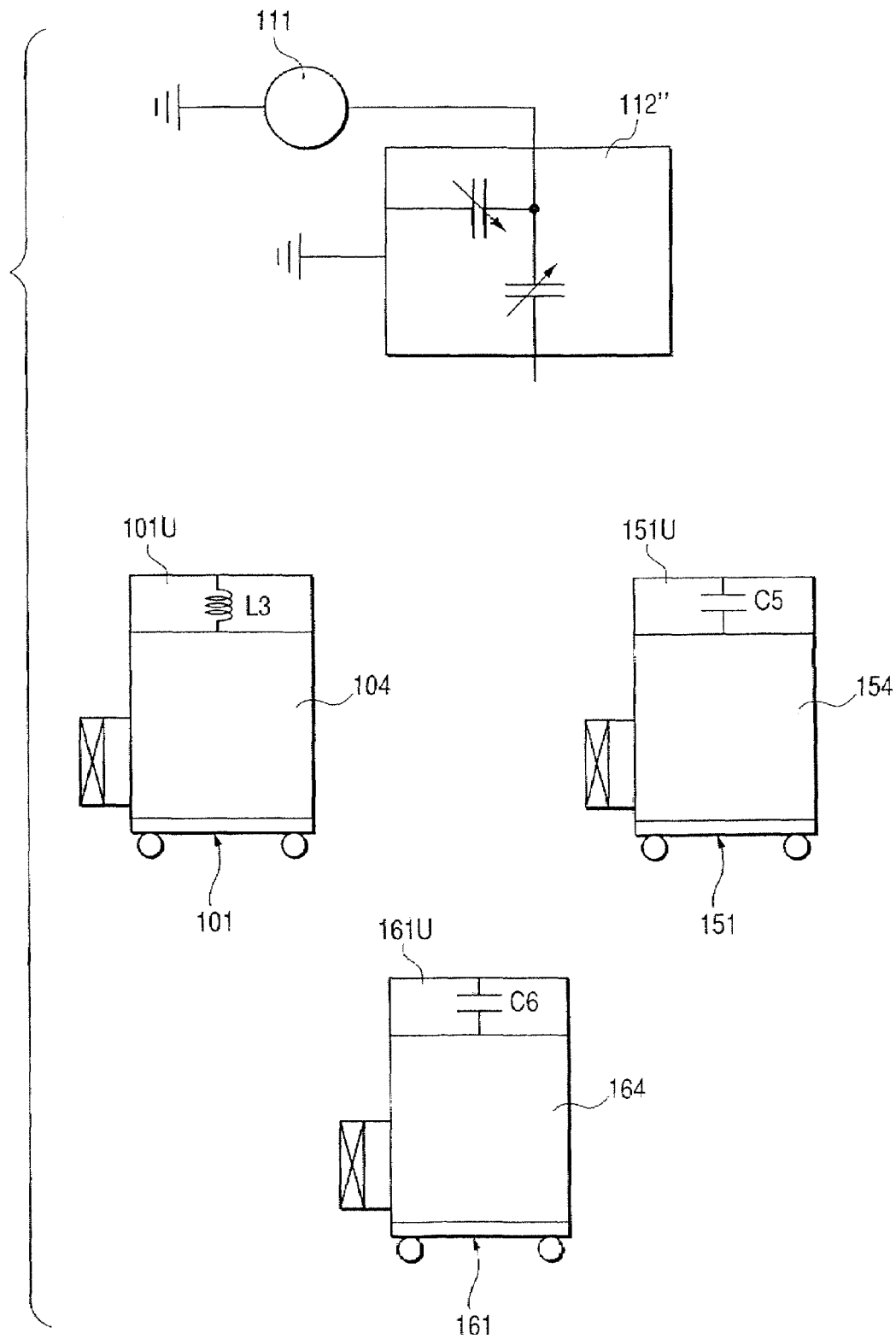
FIG. 5 is a diagrammatic illustration of still another example of the impedance regulation means used in the deposited-film formation apparatus shown in FIG. 1.

Accordingly, methods for matching impedances that do not cause any difficulties as stated above are described by giving some examples, with reference to FIGS. 3 to 5.

In an example shown in FIG. 3, matching circuit units 101U, 151U and 161U that can match the impedances of the high-frequency power supply means 110 and the respective movable reactor sections 101, 151 and 161 are kept ready for use correspondingly to the respective movable reactor sections 101, 151 and 161. The high-frequency matching device 112 has a unit attachment part 115 to which any one of the matching circuit units 101U, 151U and 161U is detachably mountable. Then, in accordance with plasma treatment in the respective movable reactor sections 101, 151 and 161, prescribed matching circuit units 101U, 151U and 161U are set to the unit attachment part 115 so as to be able to match the impedances of the movable reactor sections 101, 151 and 161 having different impedances.

In an example shown in FIG. 4, the matching circuit units 101U, 151U and 161U are incorporated in a high-frequency matching device 112', which is so constructed that any one of these matching circuit units 110U, 151U and 161U can be selected with a change-over switch 116. Then, the change-over switch 116 is turned in accordance with the plasma treatment made in the movable reactor sections 101, 151 and 161 so as to be able to match the impedances of the movable reactor sections 101, 151 and 161 having different impedances.

In an example also shown in FIG. 5, the matching circuit units 101U, 151U and 161U are not provided in a high-frequency matching device 112" but in each of the movable reactor sections 101, 151 and 161 so that the movable reactor sections 101, 151 and 161 may only be connected to the high-frequency power supply means so as to be able to match the impedances of the movable reactor sections 101, 151 and 161 having different impedances.

This method, compared with the previous two methods, makes it unnecessary to select any of the matching circuit units 101U, 151U and 161U, and hence can make handling simpler. Moreover, any mistake in selecting the matching circuit units is by no means made even when the movable reactor sections are provided in a larger number and more types. Furthermore, the plasma treatment in many types of reactors can be made using one high-frequency power supply means. Also, since the matching circuit units are provided on the side of the movable reactor sections, it is unnecessary for the variable capacitor in each matching circuit unit to be set variable in a wide range, also enabling easy microadjustment of impedances.

In the examples shown in FIGS. 3 to 5, there are no particular limitations on specific manners of regulating the impedance. Electrostatic capacitance may be regulated, or inductance coefficient may be regulated, or these may simultaneously be regulated. In the case where the electrostatic capacitance is regulated, there are no particular limitations on methods therefor. In view of the stability and reproducibility of of plasma, preferred is a method in which the capacitance is changed using a vacuum capacitor or a solid capacitor. With regard to the regulation of inductance coefficient, too, there are no particular limitations on methods therefor. When, e.g., a high-frequency power of 50 MHz or higher is used, a method in which the length of its transmission path is regulated is preferred because it enables microadjustment and is simple.

After the step of forming deposited films has been thus completed, the material gases present in the reactor 104 are sufficiently purged away or may preferably be displaced with an inert gas. Subsequently, the movable reactor section 101 is detached from the evacuation section 102, and the movable reactor section 101 is moved to a substrate take-off area (not shown).

If necessary, the substrates are cooled to the desired temperature, and thereafter an inert gas is fed into the reactor 104 through a leak valve (not shown) provided on the reactor 104 to bring the inside of the reactor 104 to atmospheric pressure. At the time the inside of the reactor 104 has been brought to atmospheric pressure, the substrates on which the deposited films have been formed are taken out of the reactor 104.

Thereafter, at the time the inside of the reactor 104 has been again brought into a deposited-film formable state by replacing component parts provided in the reactor 104 and by cleaning and so forth, the reactor 104 is then moved to the substrate set-in area described previously.

Thus, the plasma treatment apparatus so constructed that the movable reactor section 101 is set separable from the evacuation section 102 can greatly improve the production flexibility to bring about an improvement in production efficiency and a reduction of production cost. Moreover, since in the apparatus thus constructed the reactor section is movable, the substrates may be set in the reactor after the reactor section is moved to a stage for setting substrates. Hence, it is unnecessary to provide any substrate transport assembly used exclusively for transporting and setting substrates to and in each reactor when the reactor is fastened. This can simplify the production system. Hence, especially the application of the present invention in such a plasma treatment apparatus can bring out the advantages of high production flexibility, high production efficiency and production cost reduction as stated above, and is especially effective.

The use of a plurality of movable reactor sections also enables preparation for the next formation of deposited films (e.g., the setting of substrates in the reactors and the inside-evacuation of the reactor) in other movable reactor sections while the deposited films are formed in one movable reactor section through a series of the vacuum treatment steps described above. Hence, at the stage where the treatment has been completed and the movable reactor section has been detached from the evacuation section, the next movable reactor section in which the preparation for the formation of deposited films has been completed may be joined to the evacuation section to carry out the next plasma treatment immediately, enabling more efficient production.

The embodiments of the present invention have been described above taking the case of the formation of deposited films on electrophotographic light-receiving members. However, the present invention is by no means limited to the formation of deposited films, and may also be used in other plasma treatment processes such as sputtering and thermal CVD.

EXAMPLES

The present invention is described below in greater detail by giving specific working examples of the present invention in comparison with a comparative example.

Example 1

As movable reactor sections to be joined to the evacuation section 102 and connected to the high-frequency power supply means 110, a movable reactor section 201 shown in FIGS. 6A and 6B and a movable reactor section 301 shown in FIGS. 7A and 7B were used, and electrophotographic light-receiving members were produced by high-frequency plasma CVD (hereinafter "PCVD").

The construction of the movable reactor sections 201 and 301 shown in FIGS. 6A and 6B and FIGS. 7A and 7B, respectively, are described first.

As shown in FIGS. 6A and 6B and FIGS. 7A and 7B, the movable reactor sections 201 and 301 have support stands 206 and 306 which are movable by means of castors 205 and 305, cylindrical reactors 204 and 304 set on the support stands 206 and 306, cylindrical shields 217 and 317 which cover the outer sidewalls of the reactors 204 and 304, and joining flanges 208 and 308 for joining the movable reactor sections 201 and 301 to the evacuation section 102 (see FIG. 1), respectively. The reactors 204 and 304 are made of alumina ceramic. As the shields 217 and 317, those made of SUS stainless steel are used.

Figure 6A:
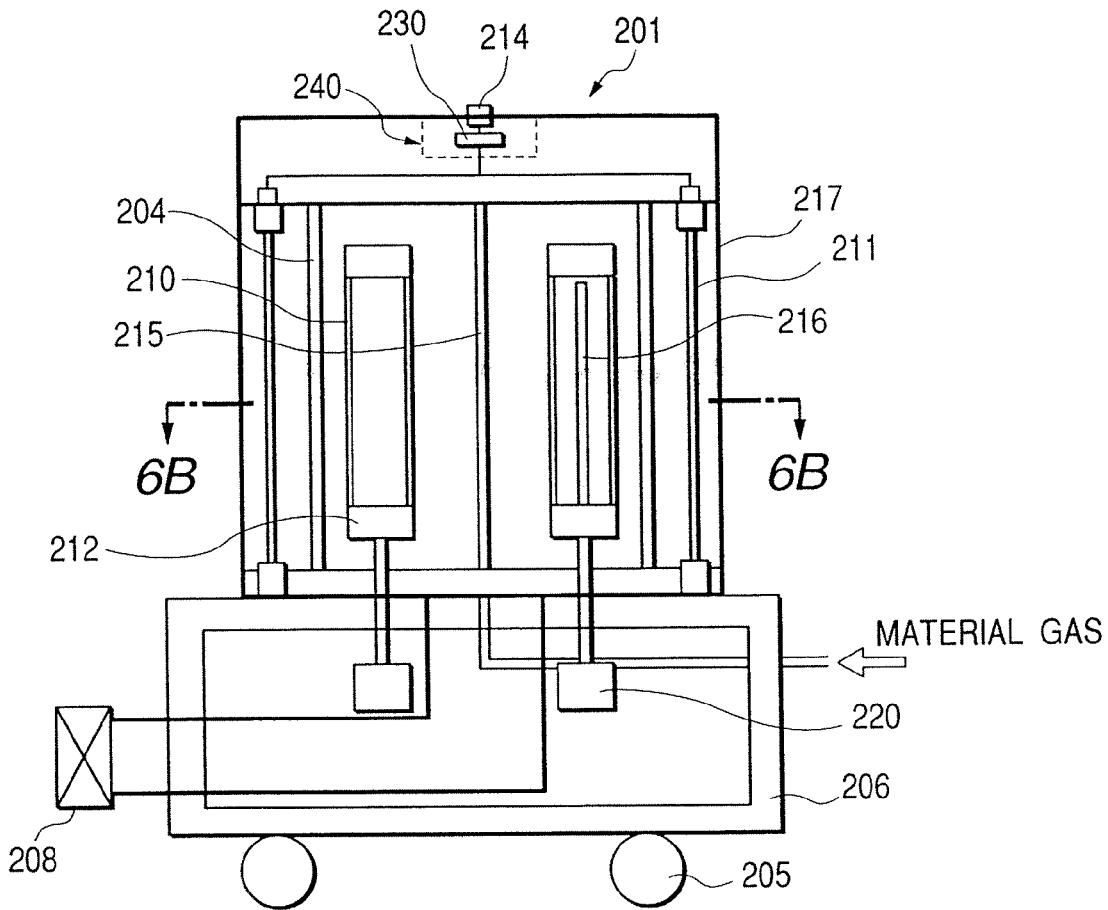
FIGS. 6A and 6B are diagrammatic illustrations of the construction of one movable reactor section used in Example 1 of the present invention.
Figure 6B:
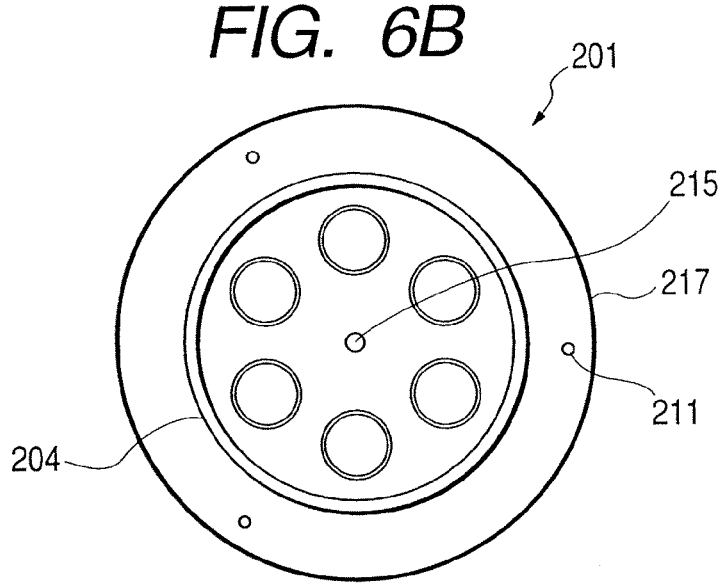

Especially as shown in FIGS. 6A and 6B, six substrate holders 212 each holding an aluminum cylinder (cylindrical substrate 210) having a length of 358 mm and an outer diameter of 80 mm and having been mirror-finished are also disposed on a concentric circle at regular intervals. Each substrate holder 212 is set rotatable around an axis parallel to the center axis of the reactor 204 by means of a motor 220. Also, heaters 216 for heating the cylindrical substrates 210 from their interiors are provided in the reactor 204 correspondingly to the respective substrate holders 212. At the center of the reactor 204, a material gas feed pipe 215 is provided through which material gases are fed into the reactor 204.

Between the shield 217 and the reactor 204, three rodlike high-frequency power electrodes 211 made of SUS stainless steel, disposed in parallel to the center axis of the reactor 204, are provided on a concentric circle at regular intervals. The high-frequency power electrodes 211 are put together at one spot at the part of an impedance regulator 240 provided above the reactor 204, and are connected to the high-frequency power supply means 110 (see FIG. 1) via a connector 214. The impedance regulator 240 has a solid capacitor 230 having an electrostatic capacitance of 30 pF, provided between the high-frequency power electrodes 211 put together at one spot and the connector 214. The electrostatic capacitance of this solid capacitor 230 is a value given previously by an experiment so as to be able to match impedances at the high-frequency power supply means 110.

Figure 7A:
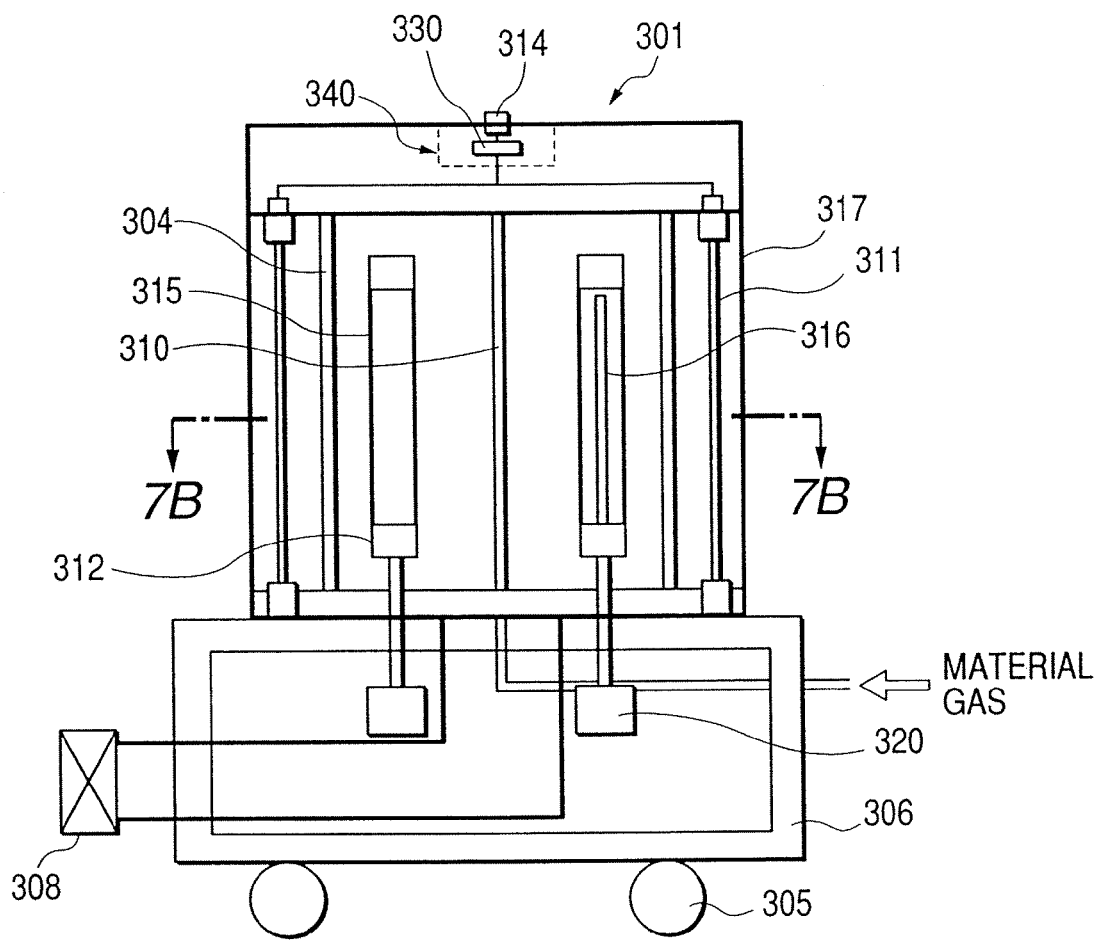
FIGS. 7A and 7B are diagrammatic illustrations of the construction of the other movable reactor section used in Example 1 of the present invention.
Figure 7B:
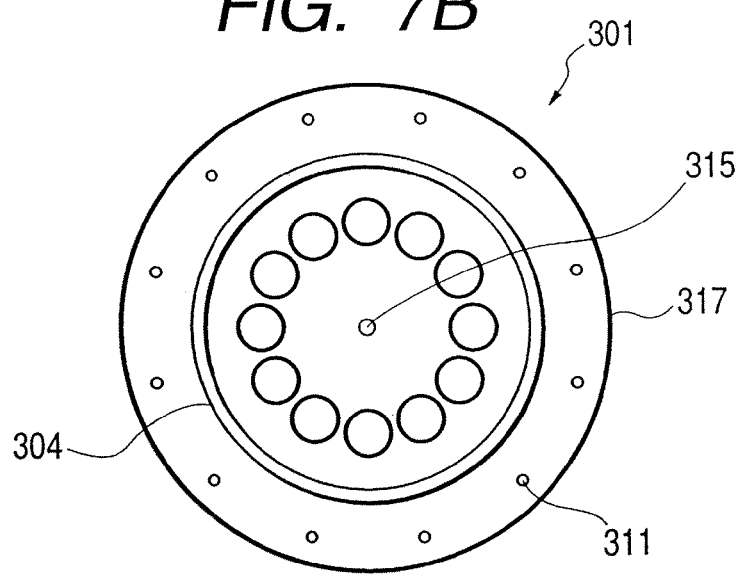

Meanwhile, as shown in FIGS. 7A and 7B, twelve substrate holders 312 each holding an aluminum cylinder (cylindrical substrate 310) having a length of 358 mm and an outer diameter of 30 mm and having been mirror-finished are disposed on a concentric circle at regular intervals. Each substrate holder 312 is set rotatable around an axis parallel to the center axis of the reactor 304 by means of a motor 320. Also, heaters 316 for heating the cylindrical substrates 310 from their interiors are provided in the reactor 304 correspondingly to the respective substrate holders 312. At the center of the reactor 304, a material gas feed pipe 315 is provided through which material gases are fed into the reactor 304.

Between the shield 317 and the reactor 304, twelve rodlike high-frequency power electrodes 311 made of SUS stainless steel, disposed in parallel to the center axis of the reactor 304, are provided on a concentric circle at regular intervals. The high-frequency power electrodes 311 are put together at one spot at the part of an impedance regulator 340 provided above the reactor 304, and are connected to the high-frequency power supply means 110 (see FIG. 1) via a connector 314. The impedance regulator 340 has a solid capacitor 330 having an electrostatic capacitance of 5 pF, provided between the high-frequency power electrodes 311 put together at one spot and the connector 314. The electrostatic capacitance of this solid capacitor 330 is a value given previously by an experiment so as to be able to match impedances at the high-frequency power supply means 110.

The formation of deposited films by the use of the above movable reactor sections 201 and 301 is described below.

First, the component parts provided in the movable reactor sections 201 and 301 were replaced and their insides were cleaned to bring them into a deposited-film formable state, where the movable reactor sections 201 and 301 were manually transported to the substrate set-in area.

In the substrate set-in area, first, in respect of one movable reactor section 201 the six cylindrical substrates 210 were respectively set to the substrate holders 212, and these were disposed at the prescribed positions inside the reactor 204. After the substrate holders 212 were disposed, the inside of the reactor 204 was evacuated by an evacuation means (not shown), and thereafter the cylindrical substrates 210 were heated to and controlled at 230° C. by means of the heaters 216. At the time the cylindrical substrates 210 came to have a prescribed temperature, the movable reactor section 201 was manually transported by an operator to the plasma treatment area. After it was transported to the plasma treatment area, the movable reactor section 201 was joined to the evacuation section 102 (see FIG. 1) via an O-ring provided between the joining flange 208 of the movable reactor section 201 and the joining flange 109 of the evacuation section 102.

After the joining of the movable reactor section 201 to the evacuation section 102 was completed, the high-frequency power supply means 110 was connected to the connector 214 of the movable reactor section 201, and the inside of the reactor 204 was evacuated by means of the evacuation means 107 of the evacuation section 102. Thereafter, material gases were fed into the reactor 204 via the material gas feed pipe 215. Having made sure that the flow rates of material gases came to any preset flow rates and also the internal pressure of the reactor 104 became stable, a prescribed high-frequency power was supplied to the cathode electrodes 211 from the high-frequency power supply means 110 to form deposited films on the cylindrical substrates 210. In the present Example, the substrate temperature, the gas flow rates of material gases, the pressure and the high-frequency power were changed to repeat the like procedure to form triple-layer deposited films as a charge injection blocking layer, a photoconductive layer and a surface layer. In the course of the formation of deposited films, the motors 220 were driven to rotate the cylindrical substrates 210. Also, the high-frequency power was set at a frequency of 105 MHz.

During the formation of deposited films in the movable reactor section 201, in respect of the other movable reactor section 301 the cylindrical substrates 310 were set in the reactor 304 in the same manner as in the movable reactor section 201, and the cylindrical substrates 310 were heated to and controlled at 230° C. by means of the heaters 316.

After the formation of deposited films was completed in the movable reactor section 201, the movable reactor section 201 was detached from the evacuation section 102, and was moved to the substrate take-off area (not shown). Thereafter, the other movable reactor section 301 was moved to the plasma treatment area, and the movable reactor section 301 was joined to the evacuation section 102. After the joining of the former to the latter was completed, the high-frequency power supply means 110 was connected to the connector 314 of the movable reactor section 301, and the deposited films having triple-layer structure as a charge injection blocking layer, a photoconductive layer and a surface layer were formed on the cylindrical substrates 310 in the same manner as in the movable reactor section 201.

Comparative Example 1

On aluminum cylinders 210 (see FIGS. 6A and 6B) each having a length of 358 mm and an outer diameter of 80 mm and aluminum cylinders 310 (see FIGS. 7A and 7B) each having a length of 358 mm and an outer diameter of 30 mm, deposited films having triple-layer structure were formed in the same manner as in Example 1 except for using movable reactor sections having the same construction as those of FIGS. 6A and 6B and FIGS. 7A and 7B except that the impedance regulators 240 and 340, respectively, were not provided for the movable reactor sections having different impedances. Thus, electrophotographic light-receiving members were produced.

In that course, in the high-frequency power supply means, high-frequency matching devices were replaced correspondingly to the respective movable reactor sections to match impedances. More specifically, when the deposited films were formed using a movable reactor section corresponding to the movable reactor section 201 shown in FIGS. 6A and 6B, the high-frequency matching device corresponding to this movable reactor section was attached to the high-frequency power supply means to form the deposited films. When the deposited films were formed using a movable reactor section corresponding to the movable reactor section 301 shown in FIGS. 7A and 7B, the high-frequency matching device was replaced with one corresponding to this movable reactor section to form the deposited films.

Conditions for the formation of deposited films on the cylindrical substrates 210 in Example 1 and Comparative Example 1 are shown in Table 1. Conditions for the formation of deposited films on the cylindrical substrates 310 in Example 1 and Comparative Example 1 are shown in Table 2.

TABLE 1

| | Charge injection blocking layer | Photo-conductive layer | Surface layer |
|---|---|---|---|
| Gases and flow rates: | | | |
| $SiH_4$ (sccm) | 300 | 300 | 30 |
| $B_2H_6$ (ppm) (based on $SiH_4$) | 3,000 | 2 | 0 |
| NO (sccm) | 9 | 0 | 0 |
| $CH_4$ (sccm) | 0 | 0 | 70 |
| Internal pressure: (Pa) | 1.1 | 1.1 | 1.4 |

TABLE 1-continued

|  | Charge injection blocking layer | Photo-conductive layer | Surface layer |
|---|---|---|---|
| High-frequency power: (W) | 1,500 | 1,500 | 1,300 |
| Substrate temperature: (° C.) | 270 | 270 | 250 |
| Layer thickness: (μm) | 3 | 25 | 0.5 |

TABLE 2

|  | Charge injection blocking layer | Photo-conductive layer | Surface layer |
|---|---|---|---|
| Gases and flow rates: |  |  |  |
| $SiH_4$ (sccm) | 150 | 150 | 20 |
| $B_2H_6$ (ppm) (based on $SiH_4$) | 2,000 | 2 | 0 |
| NO (sccm) | 8 | 0 | 0 |
| $CH_4$ (sccm) | 0 | 0 | 50 |
| Internal pressure: (Pa) | 1.1 | 1.1 | 1.4 |
| High-frequency power: (W) | 1,500 | 1,500 | 1,300 |
| Substrate temperature: (° C.) | 260 | 270 | 250 |
| Layer thickness: (μm) | 3 | 25 | 0.5 |

In both Example 1 and Comparative Example 1, stable plasma treatment was effected, and good results were obtained on the evaluation of electrophotographic light-receiving members produced.

In Comparative Example 1, however, the high-frequency matching device had to be replaced when the movable reactor section was replaced. Hence, compared with Example 1, the operation was delayed about 10 minutes before the formation of deposited films in the next movable reactor section was started. Also, in Example 1, operator's burden can be lessened for the operation unnecessary to replace the high-frequency matching device. As a result, the plasma treatment handled by one operator can be made more times or, depending on plasma treatment conditions, the number of operators can be lessened. Moreover, only one set of matching device may be used in Example 1, but in Comparative Example 1 two sets of matching devices must be used. Hence, the equipment cost can be made lower in Example 1 than in Comparative Example.

As can be seen from the foregoing, the present invention enables simplification of the production system and cost reduction and also enables simultaneous achievement of high operating efficiency and high production flexibility.

Example 2

Figure 8:
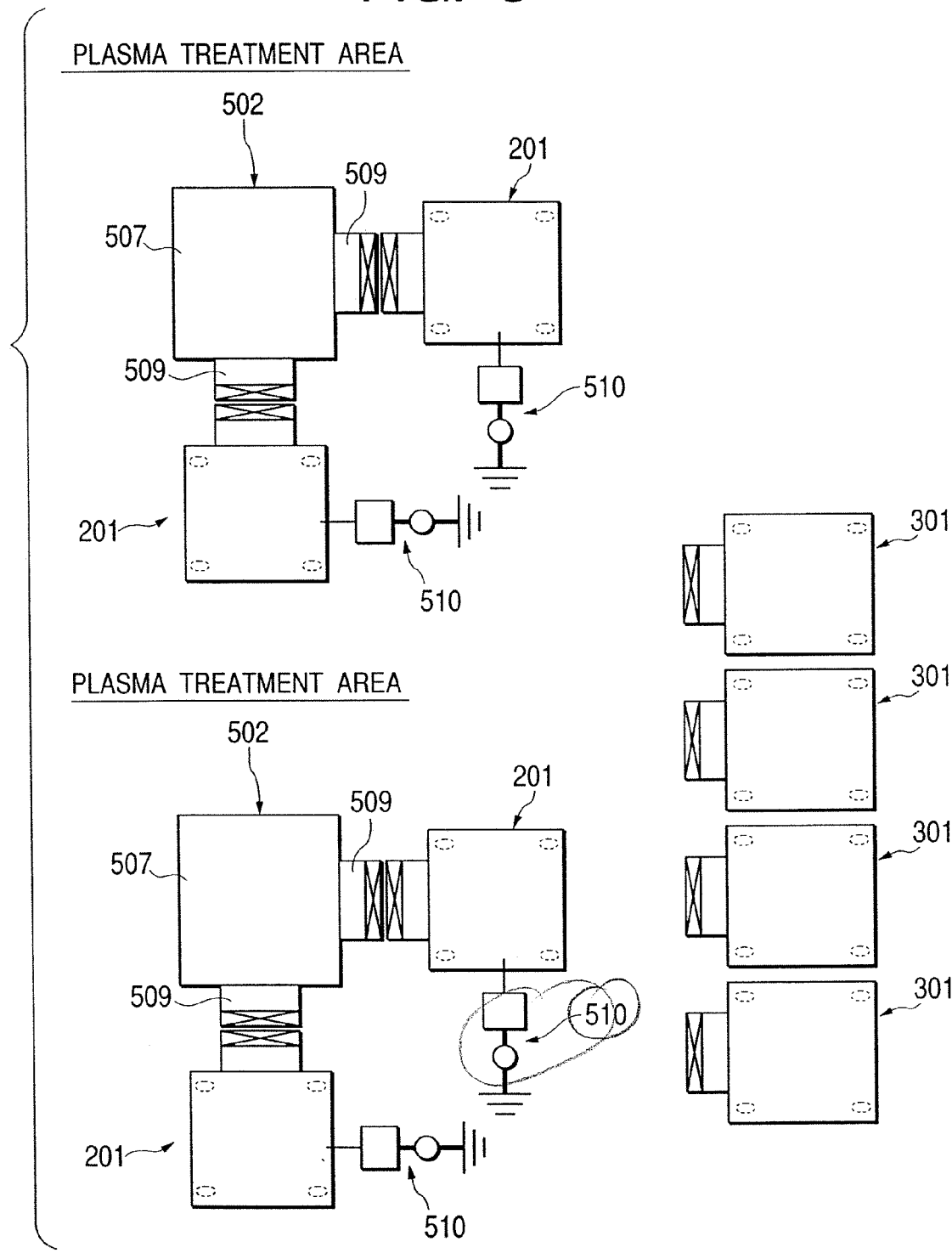
FIG. 8 is a diagrammatic illustration of the construction of a deposited-film formation apparatus used in Example 2 of the present invention.

In the present Example, electrophotographic light-receiving members were produced using a deposited-film formation apparatus shown in FIG. 8.

The deposited-film formation apparatus used in the present Example has two plasma treatment areas, and an evacuation section 502 is placed in each plasma treatment area. The evacuation sections 502 each have an evacuation means 507 provided with two joining flanges 509. Also, in the respective plasma treatment areas, two sets each of high-frequency power supply means 510 are provided. Thus, in the respective plasma treatment areas, plasma treatment can be made using two movable reactor sections of the same type. In the present Example, as the movable reactor sections, four sets each of movable reactor sections 201 having the same construction as the one shown in FIGS. 6A and 6B and movable reactor sections 301 having the same construction as the one shown in FIGS. 7A and 7B were made ready for use.

Then, the four movable reactor sections 201 were each joined to each evacuation section 502 and connected to each high-frequency power supply means 510, and deposited films were simultaneously formed in the same manner as in Example 1 and under the same conditions as those shown in Table 1. Here, the conditions shown in Table 1 are conditions in respect of each movable reactor section 201.

During the formation of deposited films in the movable reactor sections 201, in respect of the other type of movable reactor sections 301 the cylindrical substrates were set in the reactors and the substrates were kept controlled at a prescribed temperature.

After the formation of deposited films was completed in the movable reactor sections 201, all the movable reactor sections 201 were detached from the evacuation sections 502. Then the other movable reactor sections 301 were each joined to each evacuation section 502 and connected to each high-frequency power supply means 510, and deposited films were simultaneously formed in the same manner as in Example 1 and under the same conditions as those shown in Table 2. Here, the conditions shown in Table 2 are conditions in respect of each movable reactor section 301.

In the present Example, too, like Example 1, stable plasma treatment was achievable in respect of all the movable reactor sections 201 and 301, and good results were obtained on the evaluation of electrophotographic light-receiving members produced. Also, there was no waiting period for next treatment which was taken in Comparative Example 1 when the movable reactor sections 201 were replaced with the movable reactor sections 301, and the plasma treatment was smoothly shiftable.

Example 3

Figure 9:
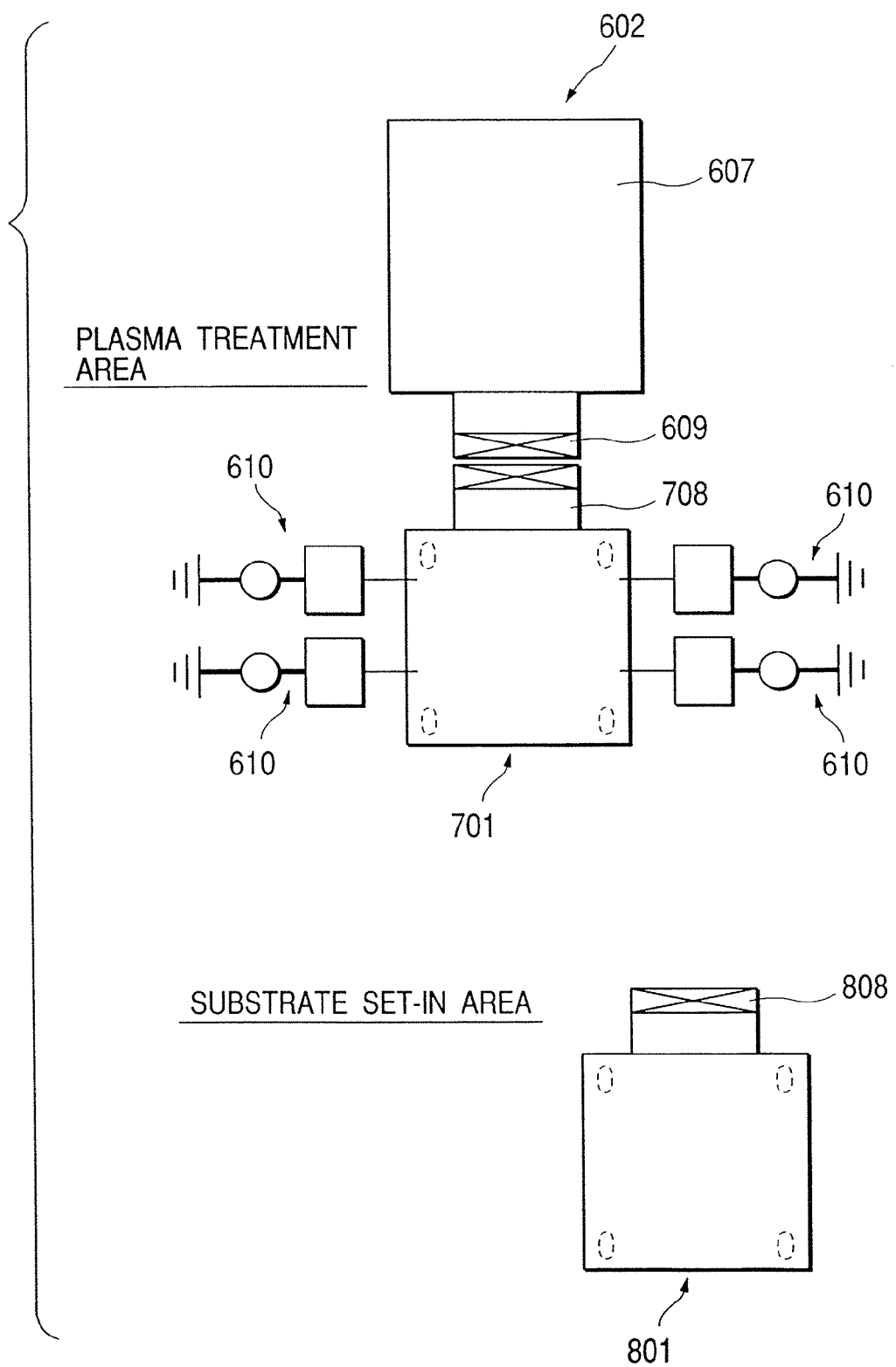
FIG. 9 is a diagrammatic illustration of the construction of a deposited-film formation apparatus used in Example 3 of the present invention.

In the present Example, electrophotographic light-receiving members were produced using a deposited-film formation apparatus shown in FIG. 9.

In the deposited-film formation apparatus shown in FIG. 9, two types of movable reactor sections 701 and 801 were used. Diagrammatic vertical cross-sectional view and transverse cross-sectional view of one movable reactor section 701 are shown in FIGS. 10A and 10B, and diagrammatic vertical cross-sectional view and transverse cross-sectional view of the other movable reactor section 801 are shown in FIGS. 11A and 11B.

As shown in FIGS. 10A and 10B and FIGS. 11A and 11B, the movable reactor sections 701 and 801 each have support stands 706 and 806 which are movable by means of castors 705 and 805, shields 717 and 817 made of SUS stainless steel which are set on the support stands 706 and 806 and partition the inside into four chambers, cylindrical reactors 704 and cylindrical reactors 804 set respectively in the chambers partitioned with the shields 717 and 817, and joining flanges 708 and 808 for joining the movable reactor sections 701 and 801 to the evacuation section 602 (shown in FIG. 9), respectively. The reactors 704 and 804 are made of aluminum, and are each held between insulating rings 721 and 821 at their top and bottom ends. At the top ends, the reactors 704 and reactors 804 are closed with covers 722 and covers 822, respectively, in the state of which they are set in the respective chambers. As the size of the reactors 704 and reactors 804, they were each 160 mm in inner diameter and 500 mm in height for those shown in FIGS. 10A and 10B, and 230 mm in inner diameter and 850 mm in height for those shown in FIGS. 11A and 11B.

Figure 10A:
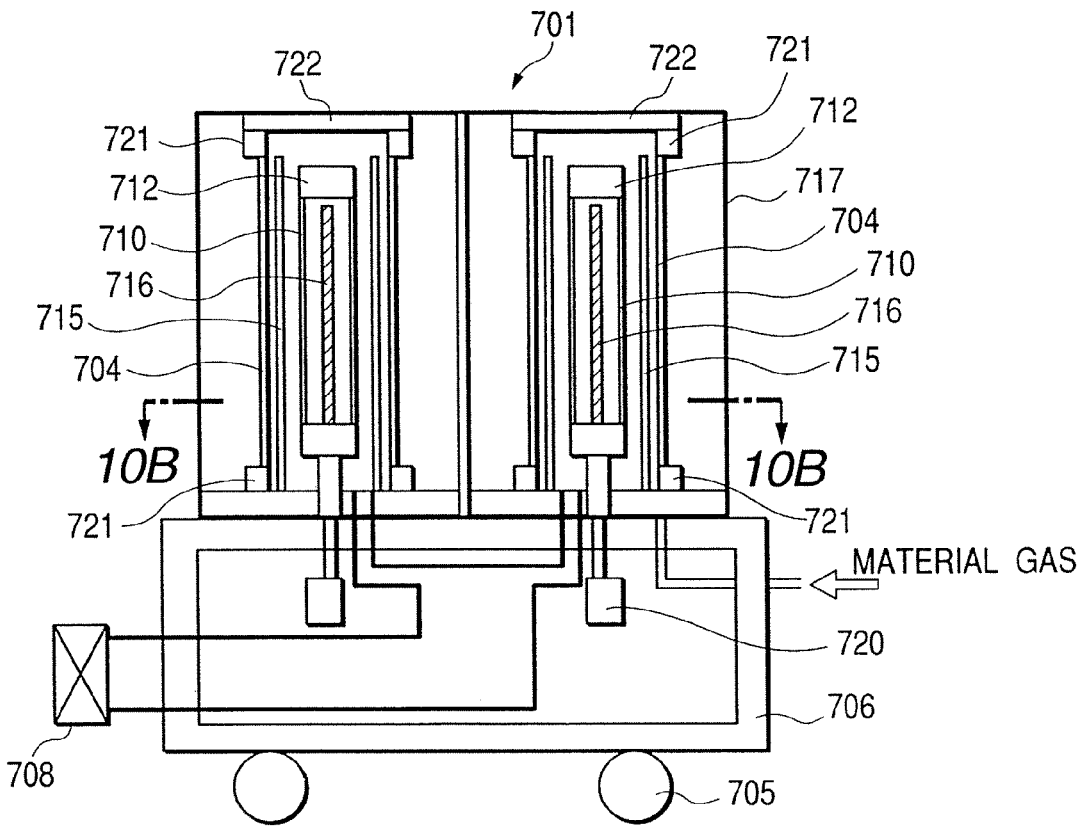
FIGS. 10A and 10B are diagrammatic illustrations of the construction of one movable reactor section of the apparatus shown in FIG. 9.
Figure 10B:
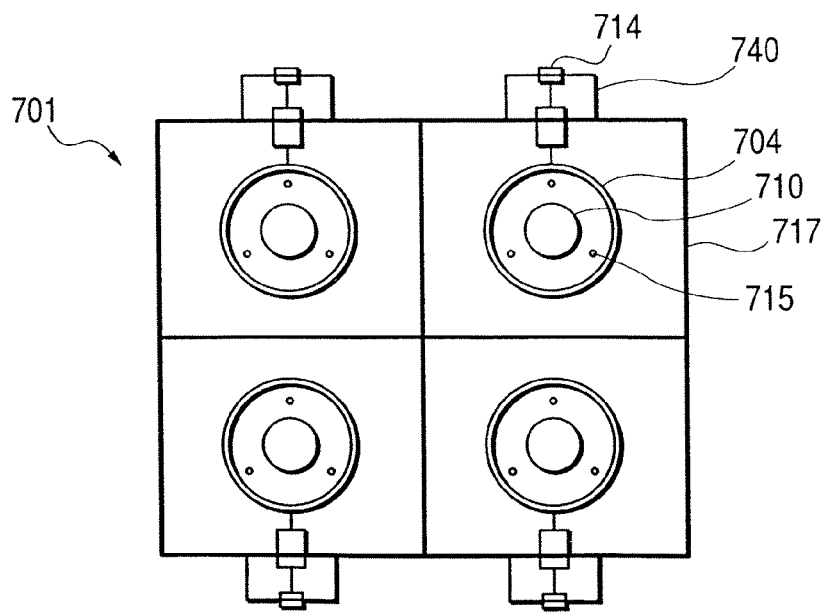
Figure 11A:
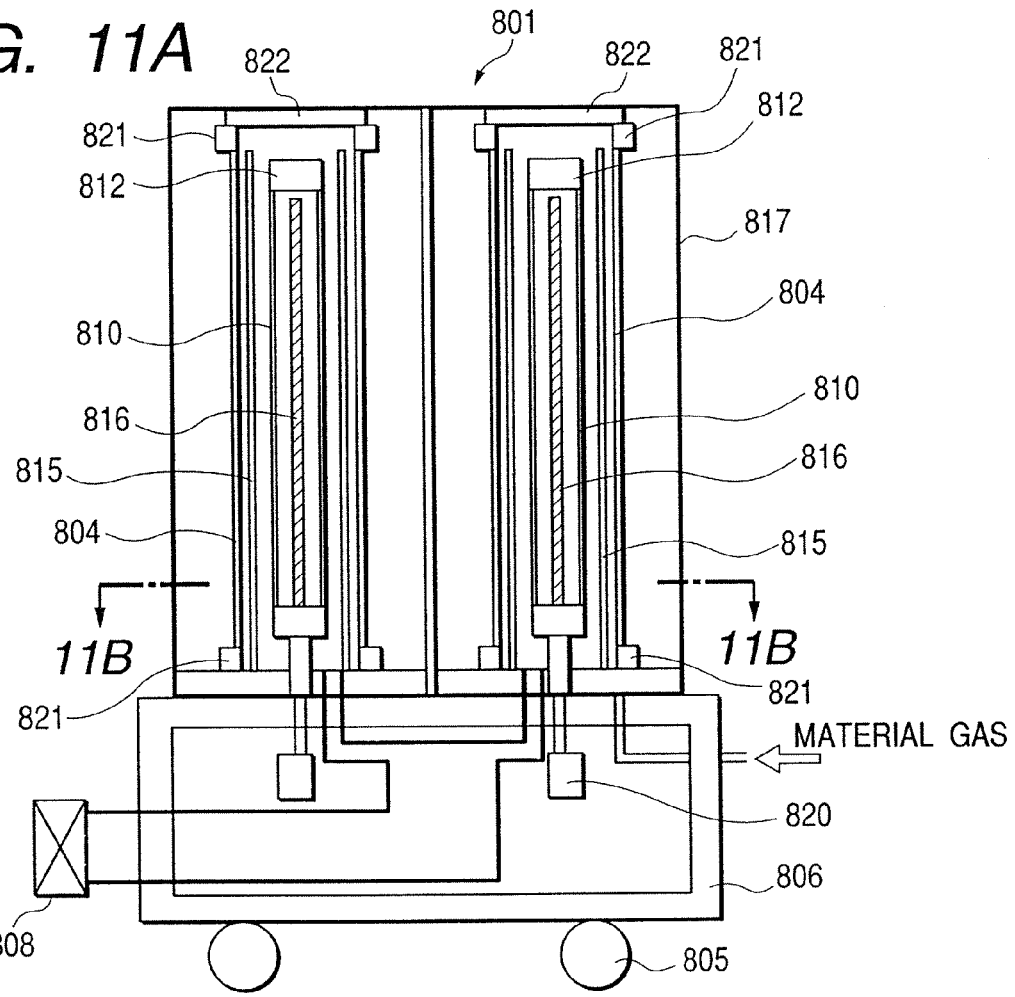
FIGS. 11A and 11B are diagrammatic illustrations of the construction of the other movable reactor section of the apparatus shown in FIG. 9.
Figure 11B:
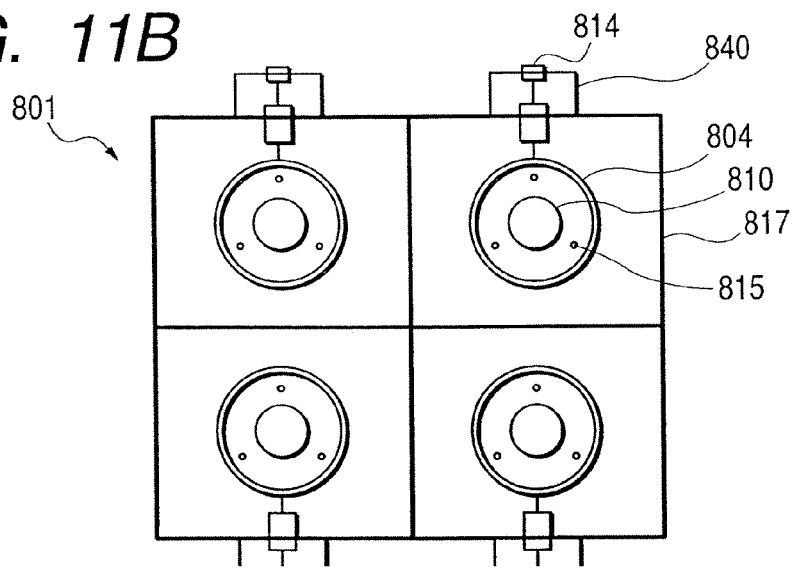
Figure 12A:
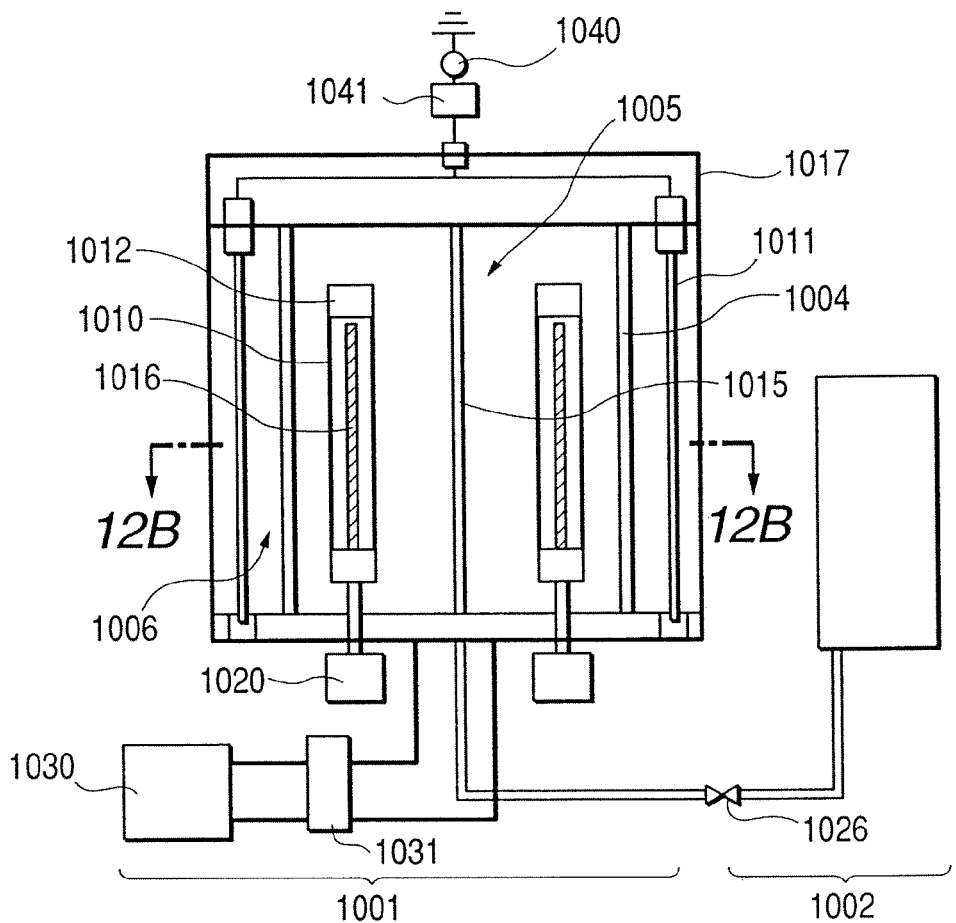
FIGS. 12A and 12B are diagrammatic illustrations of an example of the construction of a conventional deposited-film formation apparatus used to produce electrophotographic light-receiving members.
Figure 12B:
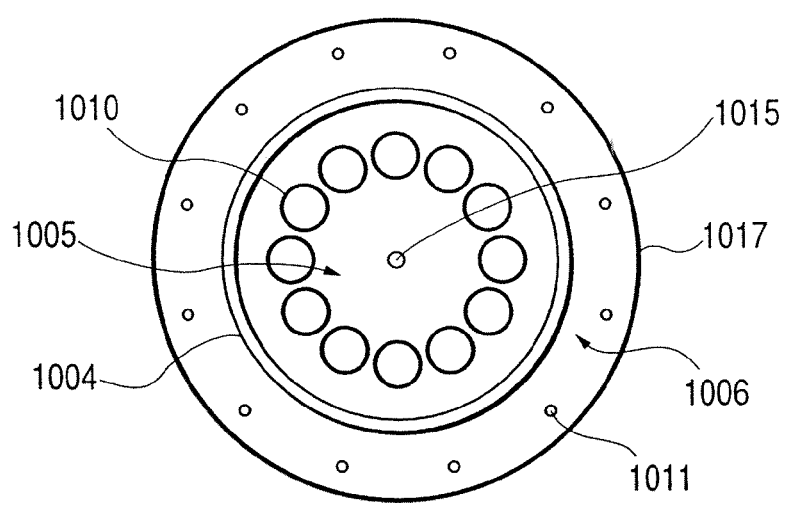

As shown in FIGS. 10A and 10B, substrate holders 712 each holding an aluminum cylinder (cylindrical substrate 710) having a length of 358 mm and an outer diameter of 30 mm and having been mirror-finished are disposed in the respective reactors 704. Each substrate holder 712 is set rotatable around an axis parallel to the center axis of each reactor 704 by means of a motor 720. Also, heaters 716 for heating the cylindrical substrates 710 from their interiors are provided in the reactors 704 correspondingly to the respective substrate holders 712. In the reactors 704, material gas feed pipes 715 are provided through which material gases are fed into the reactors 704.

Four impedance regulators 740 are attached to the outer walls of the shield 717. These impedance regulators 740 are electrically connected with the respective reactors 704 through rods each having a diameter of 16 mm, made of aluminum. Meanwhile, as shown in FIG. 9, this deposited-film formation apparatus has four high-frequency power supply means 610 in the plasma treatment area, and the respective impedance regulators 740 are connected to the respective high-frequency power supply means 610 via connectors 714. In the impedance regulators 740, the connectors 714 and the above rods having a diameter of 16 mm are each electrically connected through a sheet made of copper and having a thickness of 1 mm and a width of 20 mm. The material and size of this sheet is previously determined by an experiment so as to be able to match impedances at the high-frequency power supply means 610.

Meanwhile, as shown in FIGS. 11A and 11B, substrate holders 812 each up and down holding two aluminum cylinders (cylindrical substrate 810) having a length of 358 mm and an outer diameter of 80 mm and having been mirror-finished are disposed in the respective reactors 704. Each substrate holder 812 is set rotatable around an axis parallel to the center axis of each reactor 804 by means of a motor 820. Also, heaters 816 for heating the cylindrical substrates 810 from their interiors are provided in the reactors 804 correspondingly to the respective substrate holders 812. In the reactors 804, material gas feed pipes 815 are provided through which material gases are fed into the reactors 804.

Four impedance regulators 840 are attached to the outer walls of the shield 817. These impedance regulators 840 are electrically connected with the respective reactors 804 through rods each having a diameter of 16 mm, made of aluminum. In the impedance regulators 840, the connectors 814 and the above rods having a diameter of 16 mm are each electrically connected through a sheet made of copper and having a thickness of 1 mm, a width of 20 mm and a length which is ½ of the sheet used in the apparatus shown in FIGS. 10A and 10B. The material and size of this sheet is previously determined by an experiment so as to be able to match impedances at the high-frequency power supply means 610.

The formation of deposited films in the present Example is described below with reference to FIG. 9 to FIGS. 11A and 11B.

First, the component parts provided in the movable reactor sections 701 and 801 were replaced and their insides were cleaned to bring them into a deposited-film formable state, where the movable reactor sections 701 and 801 were manually transported to the substrate set-in area.

In the substrate set-in area, first, in respect of one movable reactor section 701 the four cylindrical substrates 710 were respectively set to the substrate holders 712, and these were disposed at the prescribed positions inside the respective reactors 704. After the substrate holders were disposed, the insides of the respective reactors 704 were evacuated by an evacuation means (not shown), and thereafter the cylindrical substrates 710 were heated to and controlled at 250° C. by means of the heaters 716. At the time the cylindrical substrates 710 came to have a prescribed temperature, the movable reactor section 701 was manually transported by an operator to the plasma treatment area. After it was transported to the plasma treatment area, the movable reactor section 701 was joined to the evacuation section 602 via an O-ring provided between the joining flange 708 of the movable reactor section 701 and the joining flange 609 of the evacuation section 602.

After the joining of the movable reactor section 701 to the evacuation section 602 was completed, the high-frequency power supply means 610 was connected to the connector 714 of the movable reactor section 701, and the insides of the respective reactors 704 were evacuated by means of the evacuation means 607 of the evacuation section 602. Thereafter, material gases were fed into the respective reactors 704 via the material gas feed pipes 715. Having made sure that the flow rates of material gases came to any preset flow rates and also the internal pressure of the respective reactors 604 became stable, a prescribed high-frequency power was supplied from the high-frequency power supply means 610 to form deposited films on the cylindrical substrates 710. In the present Example, the substrate temperature, the gas flow rates of material gases, the pressure and the high-frequency power were changed to repeat the like procedure to form triple-layer deposited films as a charge injection blocking layer, a photoconductive layer and a surface layer. In the course of the formation of deposited films, the motors 720 were driven to rotate the cylindrical substrates 710. Also, the high-frequency power was set at a frequency of 13.56 MHz.

Conditions for the formation of deposited films on the cylindrical substrates 710 in the present Example are shown in Table 3. Here, the conditions shown in Table 3 are conditions in respect of each reactor 704.

TABLE 3

|  | Charge injection blocking layer | Photo-conductive layer | Surface layer |
| --- | --- | --- | --- |
| Gases and flow rates: | | | |
| $SiH_4$ (sccm) | 100 | 100 | 10 |
| $H_2$ (sccm) | 300 | 300 | 0 |
| $B_2H_6$ (ppm) (based on $SiH_4$) | 1,500 | 1.0 | 0 |
| NO (sccm) | 5 | 0 | 0 |
| $CH_4$ (sccm) | 0 | 0 | 350 |
| Internal pressure: (Pa) | 48 | 60 | 50 |
| High-frequency power: (W) | 150 | 150 | 100 |
| Substrate temperature: (° C.) | 250 | 250 | 250 |
| Layer thickness: (μm) | 3 | 25 | 0.6 |

During the formation of deposited films in the movable reactor section 701, in respect of the other movable reactor section 801 the cylindrical substrates were set in the reactors 804 in the same manner as in the movable reactor section 701, and the cylindrical substrates 810 were heated to and controlled at 270° C. by means of the heaters 816.

After the formation of deposited films was completed in the movable reactor section 701, the movable reactor section 701 was detached from the evacuation section 602, and was moved to the substrate take-off area (not shown). Thereafter, the other movable reactor section 801 was moved to the plasma treatment area, and the movable reactor section 801 was joined to the evacuation section 602. After the joining of the former to the latter was completed, the high-frequency power supply means 610 was connected to the connector 814 of the movable reactor section 801, and the deposited films having triple-layer structure were formed on the cylindrical substrates 810 in the same manner as in the movable reactor section 701.

Conditions for the formation of deposited films on the cylindrical substrates 810 in the present Example are shown in Table 4. Here, the conditions shown in Table 4 are conditions in respect of each reactor 804.

TABLE 4

|  | Charge injection blocking layer | Photo-conductive layer | Surface layer |
|---|---|---|---|
| Gases and flow rates: |  |  |  |
| $SiH_4$ (sccm) | 300 | 300 | 30 |
| $H_2$ (sccm) | 600 | 700 | 0 |
| $B_2H_6$ (ppm) (based on $SiH_4$) | 2,000 | 1.0 | 0 |
| NO (sccm) | 9 | 0 | 0 |
| $CH_4$ (sccm) | 0 | 0 | 700 |
| Internal pressure: (Pa) | 48 | 60 | 50 |
| High-frequency power: (W) | 600 | 600 | 150 |
| Substrate temperature: (° C.) | 260 | 260 | 250 |
| Layer thickness: (μm) | 3 | 25 | 0.6 |

In the present Example, too, like Example 1, stable plasma treatment was achievable in respect of all the cylindrical substrates 710 and 810, and good results were obtained on the evaluation of electrophotographic light-receiving members produced. Also, there was no waiting period for next treatment which was taken in Comparative Example 1 when the movable reactor section 701 was replaced with the movable reactor section 801, and the plasma treatment was smoothly shiftable.

As described above, according to the present invention, a plurality of impedance regulation means are kept ready for use correspondingly to the impedances of reactors so that any prescribed impedance regulation means can be used correspondingly to the reactors in which the plasma treatment is made. Thus, the plasma treatment can be made in a good efficiency and at a low cost. Also, it has become possible to make plasma treatment of a plurality of types without causing any lowering of operating efficiency.

In addition, the reactor and the high-frequency power supply means are set separable. Hence, during plasma treatment made in respect of one reactor, other reactor having impedance different from that reactor can be made ready for the next plasma treatment. This can bring about a more improvement in production efficiency. In this case, the respective reactors may further be so constructed as to have the impedance regulation means individually. This enables prevention of any mistake in selecting the impedance regulation means when the reactor is replaced.

What is claimed is

1. A plasma treatment method in which a plurality of reactors, each provided with a cylindrical substrate provided inside of the reactor which is capable of being evacuated and a different impedance, are successively connected to a high frequency power supply to perform a plasma treatment, the method comprising:
   (a) attaching a plurality of impedance regulation means each corresponding to impedance of the respective reactors to a detachable attachment portion provided in the high-frequency power supply;
   (b) connecting the reactors to the high-frequency power supply after the attaching;
   (c) supplying high-frequency power to the reactors via the impedance regulation means;
   (d) generating a glow discharge from the supplied high-frequency power to treat a surface of the cylindrical substrate; and
   (e) successively separating the plurality of reactors from the high-frequency power supply after the surface treatment.

2. The plasma treatment method according to claim 1, wherein the surface of the substrate is plasma treated by deposited film formation.

3. The plasma treatment method according to claim 2, wherein the deposited film is a deposited film of an electrophotographic photosensitive member.

4. The plasma treatment method according to claim 1, wherein a plurality of the cylindrical substrates having a predetermined diameter are provided in one of the reactors, and a plurality of the cylindrical substrates having a diameter different from the predetermined diameter are provided in another one of the reactors.

5. The plasma-treatment method according to claim 1, wherein the impedance is regulated by electrostatic capacitance.

6. The plasma-treatment method according to claim 1, wherein the impedance is regulated by inductance coefficient.

* * * * *